(12) United States Patent
Chien et al.

(10) Patent No.: US 10,685,846 B2
(45) Date of Patent: Jun. 16, 2020

(54) SEMICONDUCTOR INTEGRATED CIRCUIT FABRICATION WITH PATTERN-REVERSING PROCESS

(71) Applicant: Taiwan Semiconductor Manufacturing Company, Ltd., Hsin-Chu (TW)

(72) Inventors: Ming-Chin Chien, Hsinchu (TW); Jui-Ching Wu, Hsinchu (TW); Shu-Hao Chang, Taipei (TW); Shang-Chieh Chien, New Taipei (TW); Jen-Yang Chung, Hsin-Chu (TW); Kuo-Chang Kau, Miaoli County (TW); Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/280,182

(22) Filed: May 16, 2014

(65) Prior Publication Data
US 2015/0332922 A1 Nov. 19, 2015

(51) Int. Cl.
*H01L 21/00* (2006.01)
*H01L 21/311* (2006.01)
*H01L 21/033* (2006.01)
*H01L 21/306* (2006.01)

(52) U.S. Cl.
CPC .... *H01L 21/31144* (2013.01); *H01L 21/0337* (2013.01); *H01L 21/30625* (2013.01)

(58) Field of Classification Search
CPC ........... H01L 21/0337; H01L 21/30625; H01L 21/31144
USPC .......................................................... 438/52
See application file for complete search history.

(56) References Cited

U.S. PATENT DOCUMENTS

| | | | |
|---|---|---|---|
| 5,652,084 A | 7/1997 | Cleeves | |
| 6,239,008 B1* | 5/2001 | Yu | H01L 21/0274 257/E21.027 |
| 6,448,164 B1* | 9/2002 | Lyons | H01L 21/0274 257/E21.027 |
| 2008/0124931 A1* | 5/2008 | Lee | H01L 21/0332 438/692 |
| 2008/0131793 A1* | 6/2008 | Lee | H01L 21/0337 430/5 |
| 2008/0254576 A1* | 10/2008 | Hsia et al. | 438/131 |
| 2009/0283852 A1* | 11/2009 | Gutmann et al. | 257/510 |
| 2013/0011783 A1* | 1/2013 | Ober | C07D 307/93 430/270.1 |
| 2013/0217217 A1* | 8/2013 | Kobayashi | H01L 21/31144 438/585 |
| 2014/0035045 A1* | 2/2014 | Alptekin | H01L 29/66545 257/368 |
| 2014/0073137 A1* | 3/2014 | Cinnor et al. | 438/703 |

* cited by examiner

*Primary Examiner* — Matthew E. Gordon
(74) *Attorney, Agent, or Firm* — Haynes and Boone, LLP

(57) ABSTRACT

A method of fabricating a semiconductor integrated circuit (IC) is disclosed. An inverse mask is provided. A sacrificial layer is deposited over a substrate. A patterned photoresist layer is formed over the sacrificial layer using the inverse mask. The sacrificial layer is then etched through the patterned photoresist layer to form a patterned sacrificial layer. A hard mask layer is deposited over the patterned sacrificial layer. The patterned sacrificial layer is then removed to form a second pattern on the hard mask layer.

19 Claims, 12 Drawing Sheets

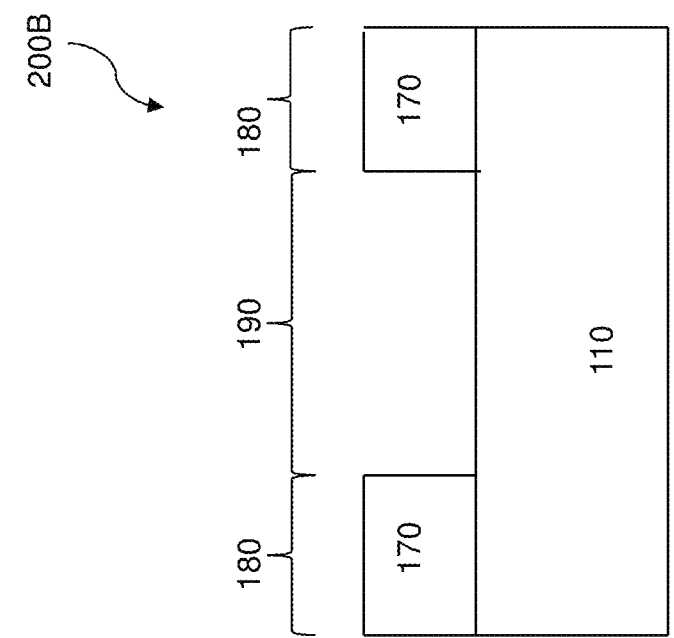
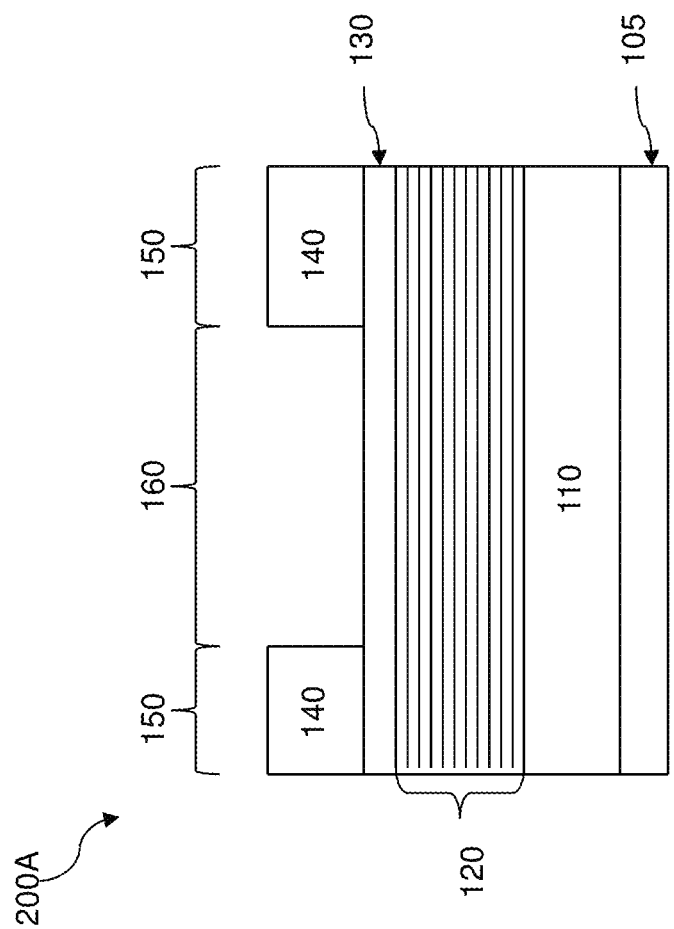

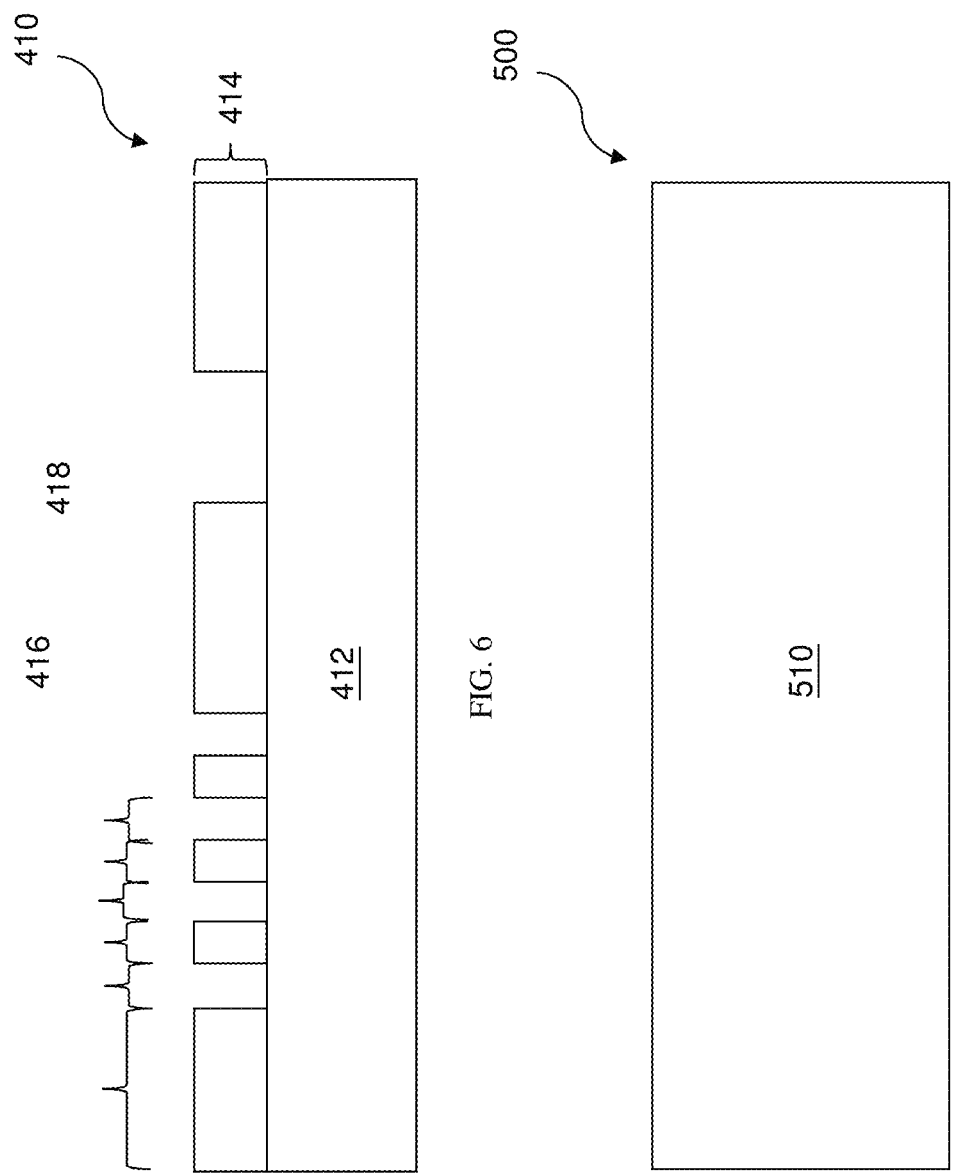

SEMICONDUCTOR INTEGRATED CIRCUIT FABRICATION WITH PATTERN-REVERSING PROCESS

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

For these advances to be realized, similar developments in IC processing and manufacturing are needed. In one example associated with lithography patterning, a photomask (or mask) to be used in a lithography process has a circuit pattern defined thereon and is to be transferred to wafers. The pattern on the mask needs to be very accurate and small, which can be adversely effected by any mask defects in the advanced technology nodes. It is desired to make improvement in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are cross sectional views of a mask constructed in accordance with some embodiments

FIGS. 6 to 13 are cross sectional views of an example IC device constructed at fabrication stages in accordance with some embodiments.

DETAILED DESCRIPTION

Figure 1:
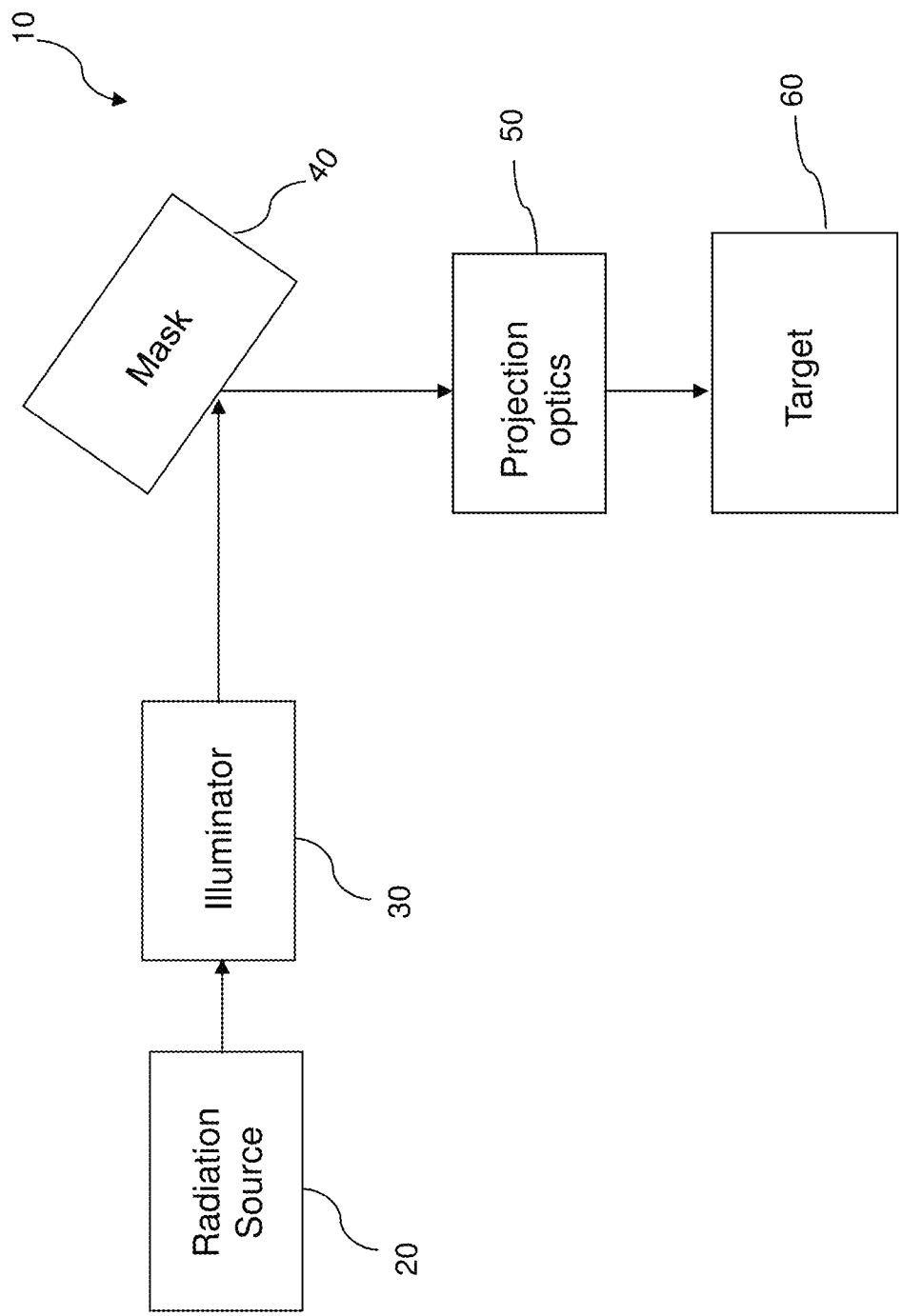
FIG. 1 is a block diagram of a lithography system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a lithography process 10 that may benefit from one or more embodiments of the present invention is disclosed. The lithography system 10 employs a radiation source 20. The radiation source 20 may be any suitable light source, such as a Krypton Fluoride (KrF) excimer laser with wavelength of 248 nm, an Argon Fluoride (ArF) excimer laser with a wavelength of 193 nm, a Fluoride (F2) excimer laser with a wavelength of 157 nm, or other light sources having a longer wavelength. The radiation source 20 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The lithography process 10 also employs an illuminator 30, which may comprise refractive optics such as a single lens or a lens system having multiple lenses, and reflective optics such as mirrors. For example, the illuminator 30 may include microlens arrays, shadow masks, and/or other structures designed to aid in directing light from the light source 20 towards the mask 40.

The lithography process 10 also employs a mask 40 (in the present disclosure, the terms mask, photomask, and reticle are used to refer to the same item). The mask 40 can be a transmissive mask or a reflective mask. A transparent mask includes a transparent substrate and a patterned absorption (opaque) layer. A light beam may be partially or completely blocked when directed on an opaque region. The opaque layer may be patterned to have one or more openings through which an incident light may travel through (for a transparent mask) or reflect from a reflective region (for a reflective mask). A reflective mask includes an absorptive region and a reflective region. In the absorption region, a light beam may be partially or completely absorbed by an absorption layer, while in the reflective region, the absorption layer is removed and an incident light is reflected by a reflective multilayer (ML).

The lithography process 10 also employs a projection optics box (POB) 50. The POB 50 may have refractive optics or reflective optics. The radiation reflected from the mask 40 (e.g., a patterned radiation) is collected by the POB 50. The POB 50 may include a magnification of less than one (thereby reducing the patterned image included in the radiation).

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40. A fabrication of the mask 40 may include two steps: a blank mask fabrication process and a mask patterning process. During the blank mask fabrication process, a blank mask is formed by depositing suitable layers (e.g., multiple reflective layers) on a suitable substrate. The blank mask is patterned during the mask patterning process to have a design pattern for a layer of an integrated circuit (IC) device (e.g., chip). The patterned mask is then used to transfer the design pattern onto a semiconductor wafer. The design pattern can be transferred over and over onto multiple wafers through various lithography processes. Several masks (for example, a set of 15 to 30 masks) may be used to construct a complete IC device.

Referring to FIGS. 2A and 2B, a mask substrate includes a material layer 110. The layer 110 may be made of low thermal expansion material (LTEM). As an example, the LTEM may include $TiO_2$, doped $SiO_2$, and/or other low thermal expansion materials known in the art. The LTEM layer 110 serves to minimize image distortion due to mask heating.

Now referring to FIG. 2A, for a reflective mask 200A, a reflective multilayer (ML) 120 is formed over the LTEM layer 110. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. A capping layer 130 is formed over the ML 120 to prevent oxidation of the ML 120. The capping layer 130 includes ruthenium (Ru), Ru compounds such as RuB, RuSi, chromium (Cr), Cr oxide, and Cr nitride. An absorption layer 140 is formed over the capping layer 130. The absorption layer 140 includes multiple film layers from a group consisting of tantalum (Ta), tantalum boron nitride (TaBN), tantalum, titanium, or aluminum-copper, palladium, tantalum nitride, aluminum oxide, molybdenum (Mo), or other suitable materials. In addition, a conductive layer 105 may be deposited under (as shown in the figure) the LTEM layer 110 for the electrostatic chucking purpose. In an embodiment, the conductive layer 105 includes chromium nitride (CrN), though other compositions are possible.

The absorption layer 140 is patterned to form the design layout pattern EUV mask 200A. In some embodiments, the absorption layer 140 is patterned to define two regions, an absorptive region 150 and a reflective region 160. A patterning process may include resist coating (e.g., spin-on coating), exposure, developing the resist, other suitable processes, and/or combinations thereof. Alternatively, the photolithography exposing process is implemented or replaced by other proper methods such as maskless photolithography, electron-beam writing, direct-writing, and/or ion-beam writing. An etching process is performed next to remove portions of the absorption layer 140 to form the reflective region 160. Meanwhile, in the absorptive region 150, the absorption layer 140 remains.

Now referring to FIG. 2B, for a transmissive mask 200B, a patterned absorption (an opaque) layer 170 is formed over the LTEM layer 110. In some embodiments, the patterned absorption layer 170 defines two regions: an absorptive region 180 and a transmissive region 190. The patterned opaque layer 170 includes chromium, chromium oxide, aluminum-copper palladium, tantalum nitride, aluminum oxide titanium, tungsten, and/or combinations thereof. The patterned opaque layer 170 is formed similarly in many respects to the patterned absorption layer 140 discussed above in association with FIG. 2A.

Figure 3:
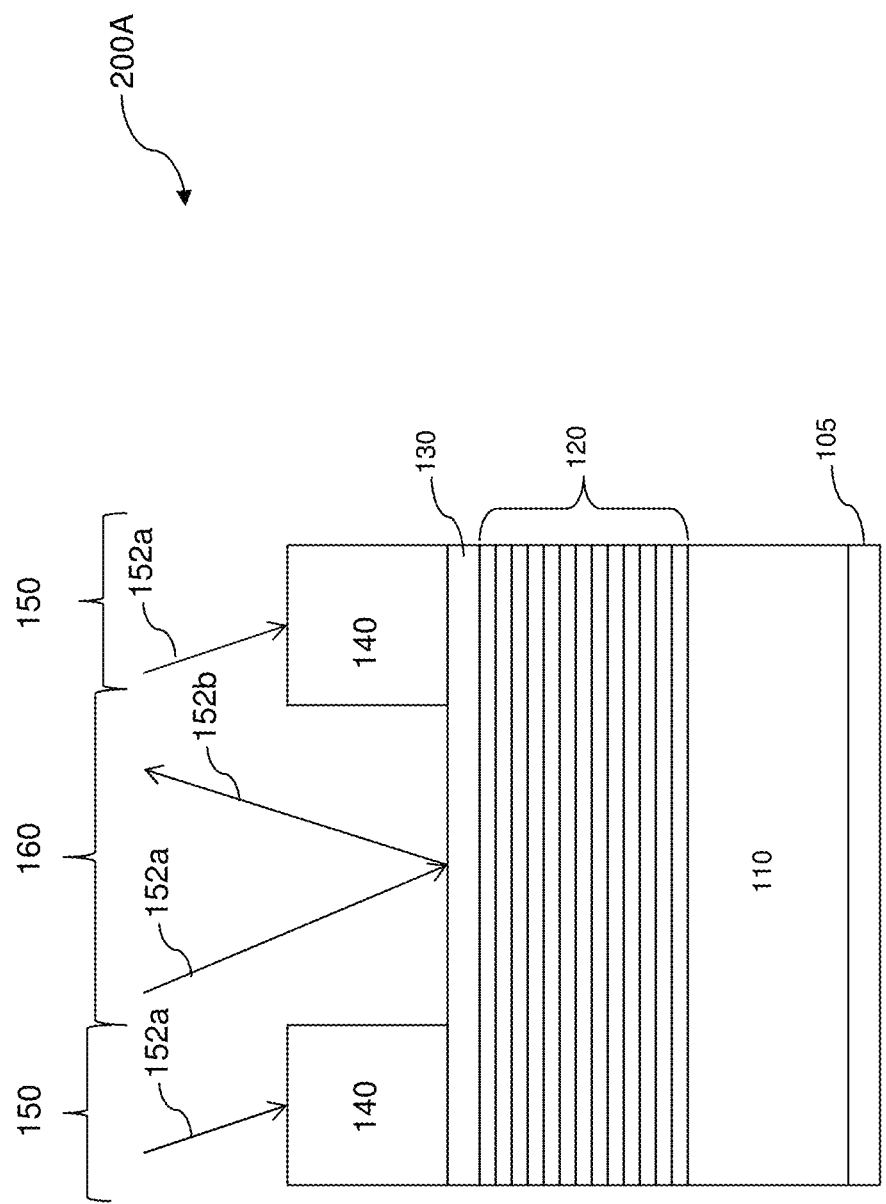
FIG. 3 is cross sectional view of a mask used in a lithography exposing tool that can benefit from one or more embodiments of the present disclosed method.

As shown in FIG. 3, when an illumination beam 152a is projected on a mask, such as the reflective mask 200A, a portion of the illumination beam 152a projected on the absorptive region 150 is absorbed by the absorption layer 140 and another portion of the illumination beam 152a projected on the reflective region 160 is reflected by the reflective ML 120. A patterned illumination bean 152b is thereby generated. The patterned illumination beam 152b is used to expose a resist film deposited on a wafer substrate and a resist pattern is formed on the wafer substrate.

Figure 4:
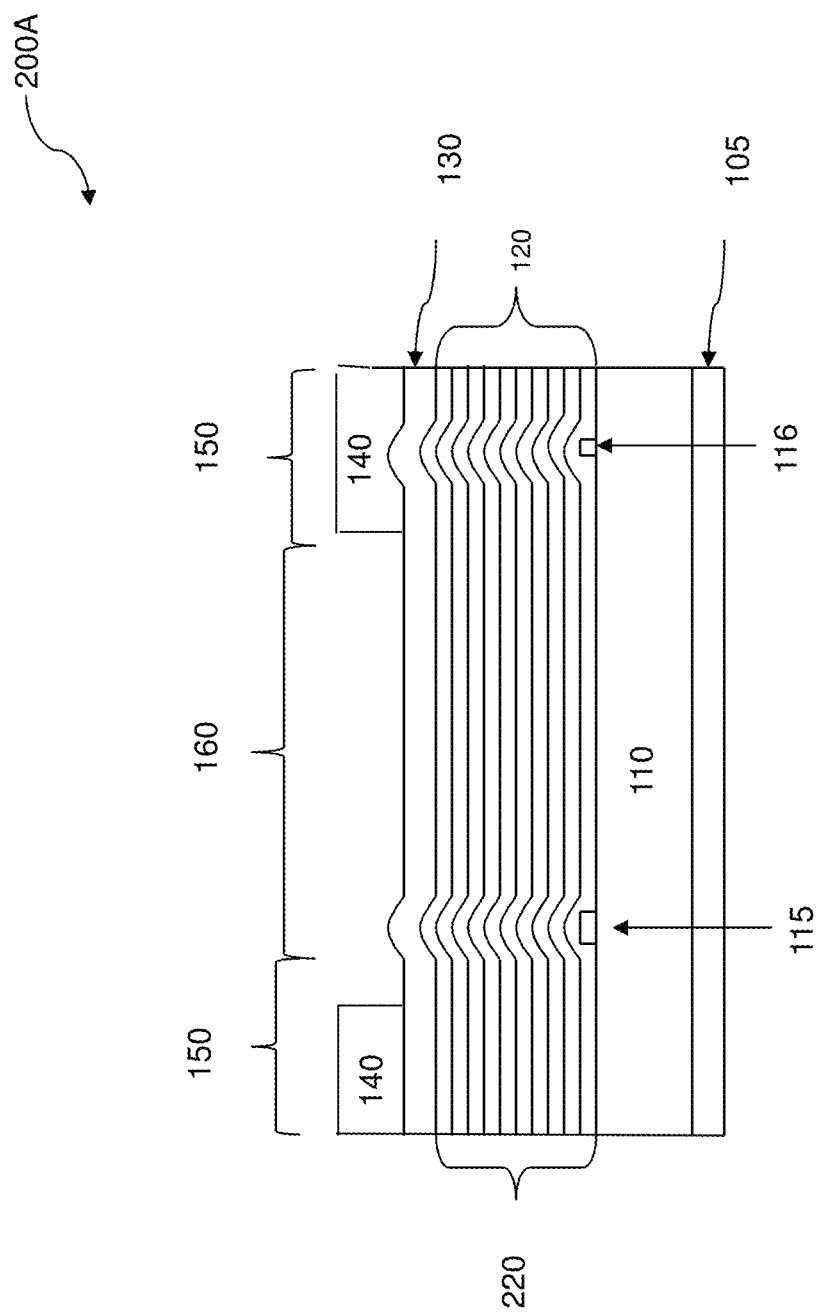
FIG. 4 is cross sectional view of exemplary defects in a reflective mask constructed in accordance with some embodiments.

One challenge in lithography occurs when defects exist in/on a reflective region or a transmissive region of a mask. In one example, a defect 115 is a bump-type defect and is located under the reflective ML 120 in the reflective region 160, as shown in FIG. 4. It may change profile of the reflective ML 120 surface and therefore it may distort the reflected illumination beam from the surface of the reflective ML 120. The defect 115 may include a pit-type defect, a residue of the absorption layer left in the reflective region or the transmissive region, or particles induced during mask fabrication. Thus when a mask having a defect in its reflective region (or its transmissive region) is then used to transfer the design pattern onto a semiconductor wafer, the defect may be printed to the semiconductor wafer, referred to as a printable defect. On the other hand, a defect 116 locates in the absorptive region 150 and it is covered by the absorption layer 140, as shown in FIG. 4. Since most of incident light is absorbed by the absorption layer 140, the defect 116 may not be printed to the semiconductor wafer.

Generally, an area ratio R of reflective regions to absorptive regions (or transmissive regions to absorptive regions) of a mask varies from one IC device manufacturing stage to another one. For example, a poly gate marks, or an active-area mask, may have a greater area ratio R than a metal line mask. In other words, a poly gate mask and an active-area mask may be more vulnerable to printable defects. In some embodiment, when the area ratio R is greater than one, the mask is referred to as a bright field mask; when the area ratio R is less than one, the mask is referred to as a dark field mask. The present disclosure offers a method to reduce printable defects for a bright field mask.

Figure 5:
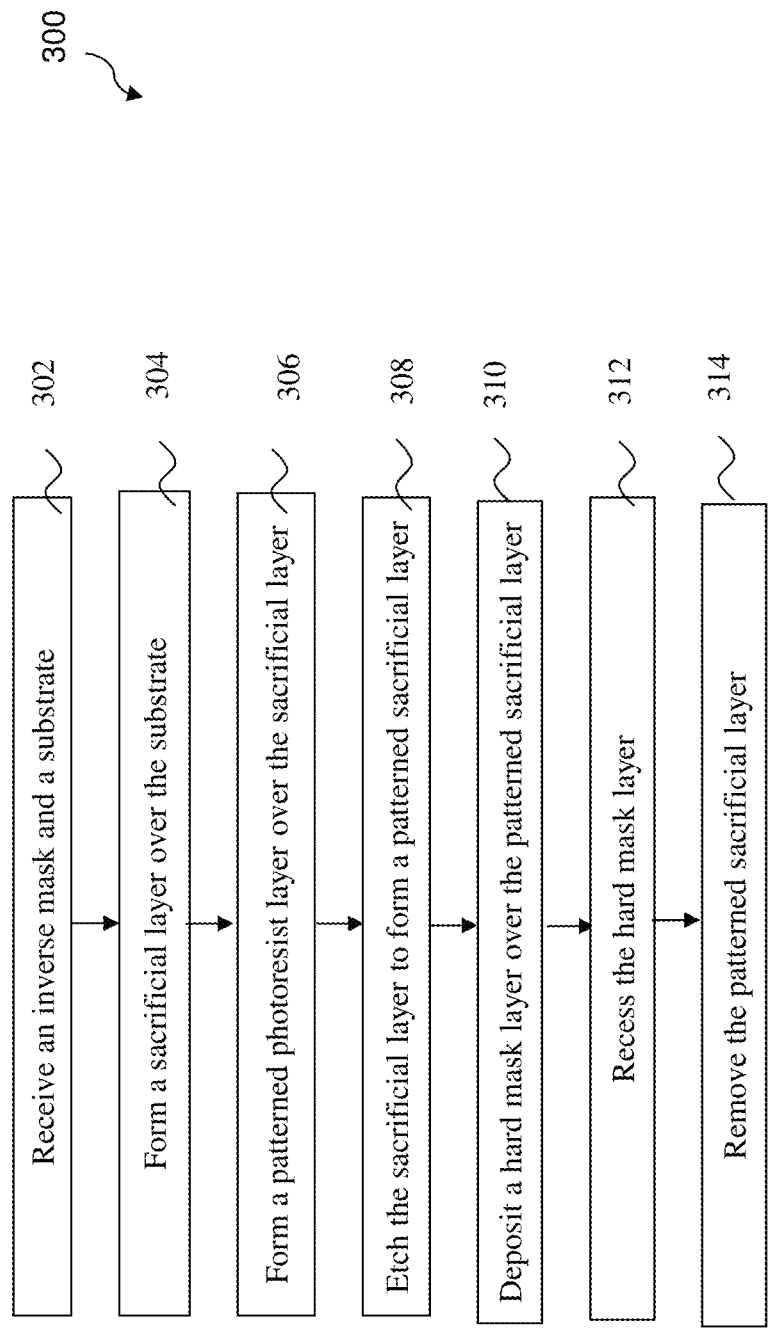
FIG. 5 is a flowchart of an example method for fabricating a semiconductor integrated circuit (IC) constructed in accordance with some embodiments.

FIG. 5 is a flowchart of a method 300 of fabricating one or more IC devices in accordance with some embodiments. The method 300 is discussed in detail below, with reference to an inverse mask 410, shown in FIG. 6, and an IC device 500, shown in FIGS. 7 to 13, for the sake of example.

Referring to FIGS. 5-7, the method 300 starts at step 302 by receiving an inverse mask 410 and a substrate 510 of the IC device 500. The inverse mask 410 has a first pattern. The inverse mask 410 is an inverse version of what a regular mask of a design layout would be. In another word, the first pattern is an inverse pattern of a patterned feature to be formed over the substrate. In one embodiment, the inverse mask 410 is a dark field mask while the regular mask is a bright field mask.

The inverse mask 410 includes a blank mask 412 and a patterned absorption layer 414. The inverse mask 410 has a first pattern defined by two regions, an opaque region 416 and a reflective (or transmissive) region 418. In the reflective (or transmissive, depending on the embodiment) region 418, the absorption layer is removed to allow light be reflected or transmitted from it, and in the opaque region 416, the absorption layer remains. Therefore, the regular mask would include an opaque region in a first location and a reflective (or transmissive) region in a second location. In contrast, the inverse mask 410 includes an opaque region in the second location and a reflective (or transmissive) region in the first location. Said differently, where there would be an opaque region in the regular mask, there is a reflective (or transmissive) region in the inverse mask 410; and where there would be a reflective (or transmissive) region in the regular mask, there is an opaque region in the inverse mask 410. An area ratio R of the inverse mask 410 reverses an area ratio r of the respective regular mask. Therefore defects in the reflective (or transmissive) region in the regular mask may now be in the opaque region 416 of the inverse mask 410 and that may reduce printable defects on a wafer when using the inverse mask 410 in a lithography process. For example, an inverse poly gate mask 410 may have less printable defects than the respective regular poly gate mask.

The substrate 510 may be a bulk silicon substrate. Alternatively, the substrate 510 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide, or combinations thereof. Possible substrates 510 also include a silicon-on-insulator (SOI) substrate. SOI substrates are fabricated using separation by implantation of oxygen (SIMOX), wafer bonding, and/or other suitable methods.

The substrate 510 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 510, in a P-well structure, in an N-well structure, in a dual-well structure, or using a raised structure. The substrate 510 may further include various active regions, such as regions configured for an N-type metal-oxide-semiconductor (NMOS) transistor device and regions configured for a P-type metal-oxide-semiconductor (PMOS) transistor device.

The substrate 510 may include isolation region to isolate active regions of the substrate 510. The isolation region may be formed using traditional isolation technology, such as shallow trench isolation (STI), to define and electrically isolate the various regions. The isolation region comprises silicon oxide, silicon nitride, silicon oxynitride, an air gap, other suitable materials, or combinations thereof. The isolation region is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

Figure 8:
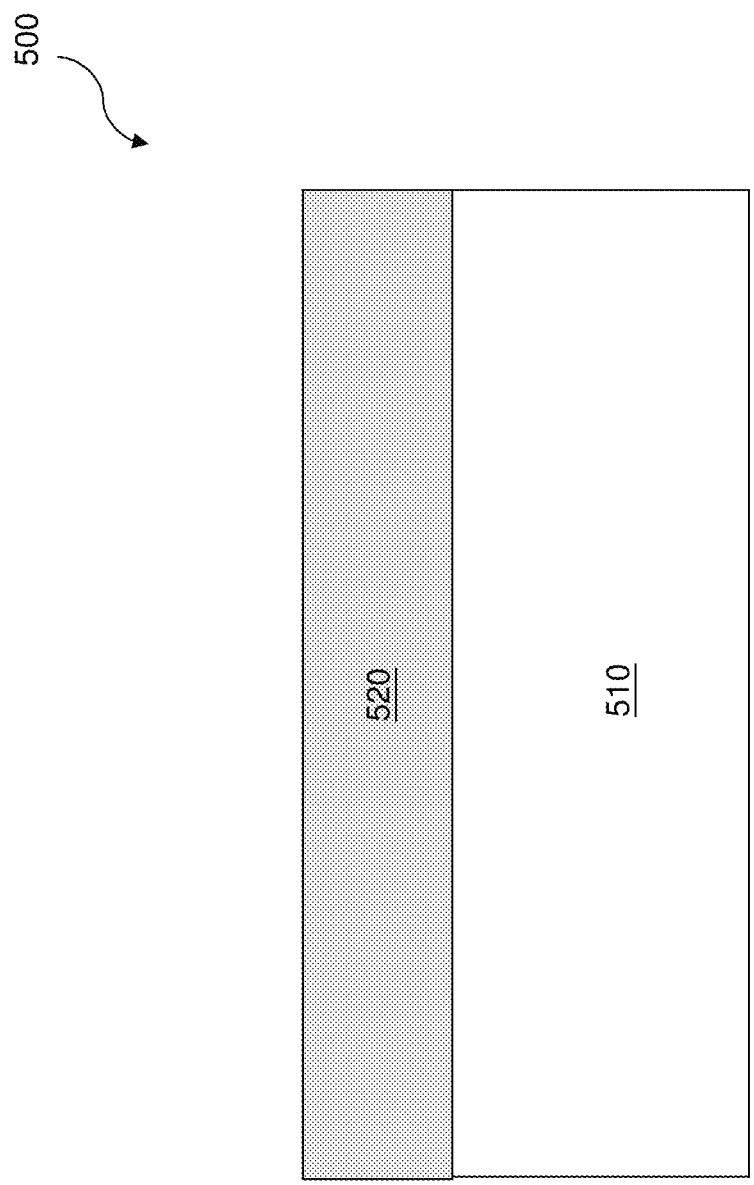

Referring to FIGS. 5 and 8, the method 300 proceeds to step 304 by forming a sacrificial layer 520 over the substrate 510. In one embodiment, the sacrificial layer 520 includes an antireflective coating (ARC) layer deposited by spin-on coating technique. The sacrificial layer 520 may also include a carbon-rich pattern transfer underlayer, such as phenyl, naphthyl, anthracenyl group polymer. In another embodiment, the sacrificial layer 520 includes multiple layers, such as to gain process flexibility in subsequent processes. For example, the sacrificial layer 520 includes a bottom layer deposited over the substrate 510 and a middle layer deposited over the bottom layer. The bottom layer may include a silicon oxide carbon layer. The middle layer may include a silicon-rich layer. The sacrificial layer 520 can be formed by processes such as chemical vapor deposition (CVD), spin-on coating, or other suitable techniques.

Figure 9:
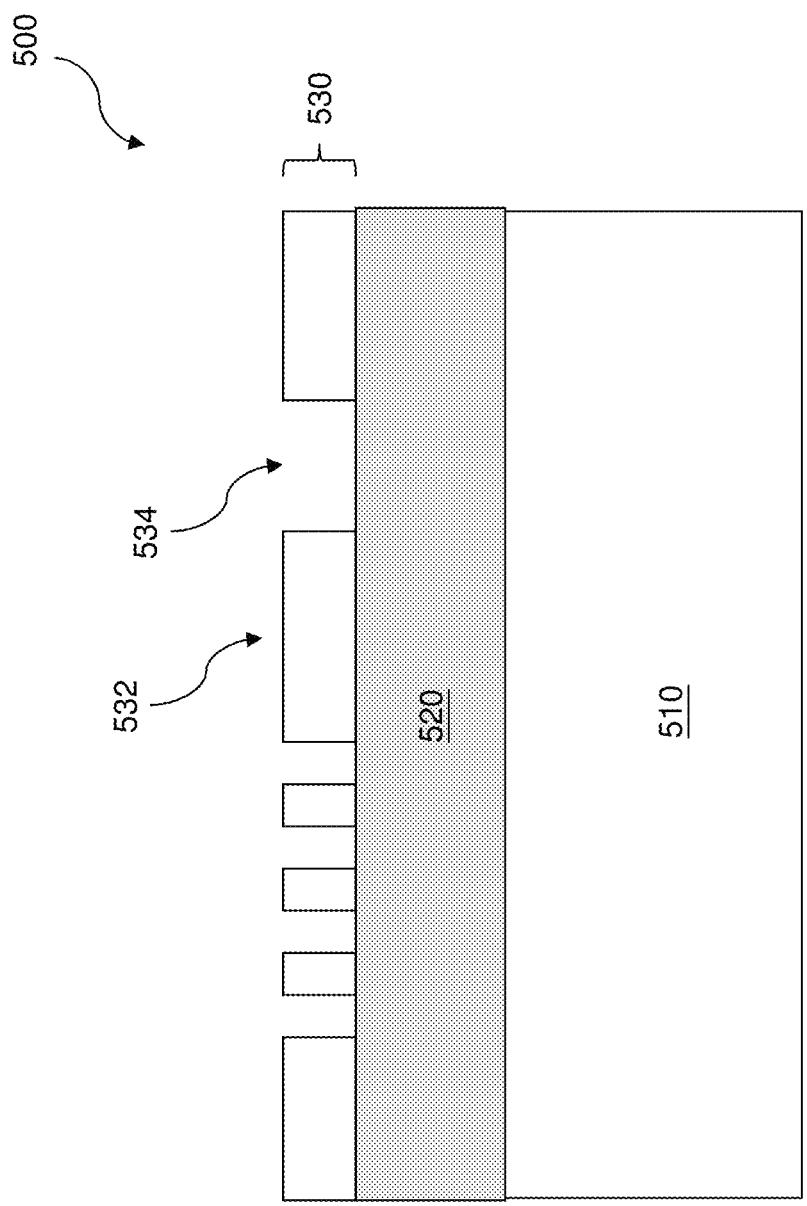

Referring to FIGS. 5 and 9, the method 300 proceeds to step 306 by forming a patterned photoresist layer 530 over the sacrificial layer 520. In one embodiment, a photoresist layer is coated over the sacrificial layer 520. An exposure process is performed on the photoresist layer by using the inverse mask 410. If the exposed regions become more soluble, the photoresist is referred to as a positive type. If the exposed regions become less soluble, the photoresist is referred to as a negative type. Baking processes may be performed before or after exposing the substrate, such as a post-exposure baking process. A developing process selectively removes the exposed or unexposed regions with a developing solution forming the pattern photoresist layer 530 over the sacrificial layer 520.

The patterned photoresist layer 530 carries the first pattern defined by two regions, a first region 532, where the photoresist layer remains and a second region 534, where the photoresist layer is removed. Therefore, the respective opaque region 416 of the inverse mask 410 is transferred to the first region 532 and the respective reflective (or transmissive) region 418 of the inverse mask 410 is transferred to the second region 534.

Figure 10:
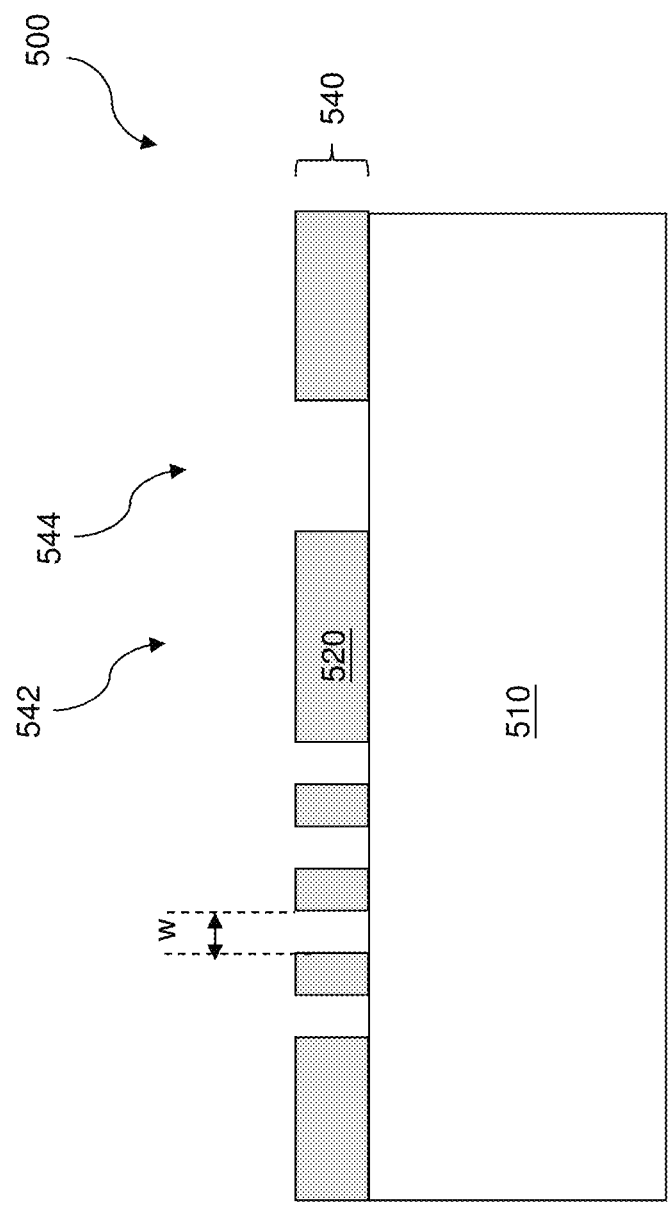

Referring to FIGS. 5 and 10, the method 300 proceeds to step 308 by etching the sacrificial layer 520 through the patterned photoresist layer 530 to form a patterned sacrificial layer 540. The etching processes include dry etching, wet etching, and/or other suitable etching techniques. The patterned sacrificial layer 550 carries the pattern of the patterned photoresist layer 530, which is defined by a third region 542 where the sacrificial layer 520 remains and a fourth region 544 where the sacrificial layer 520 is removed. In one embodiment, the fourth region 544 includes different width and a smallest width w is in a range of about 20 nm to about 60 nm. Thus the first pattern of the inverse mask 410 is transferred to the patterned sacrificial layer 540. After etch the sacrificial layer, a photoresist strip process is applied to remove the patterned photoresist layer 530.

Figure 11:
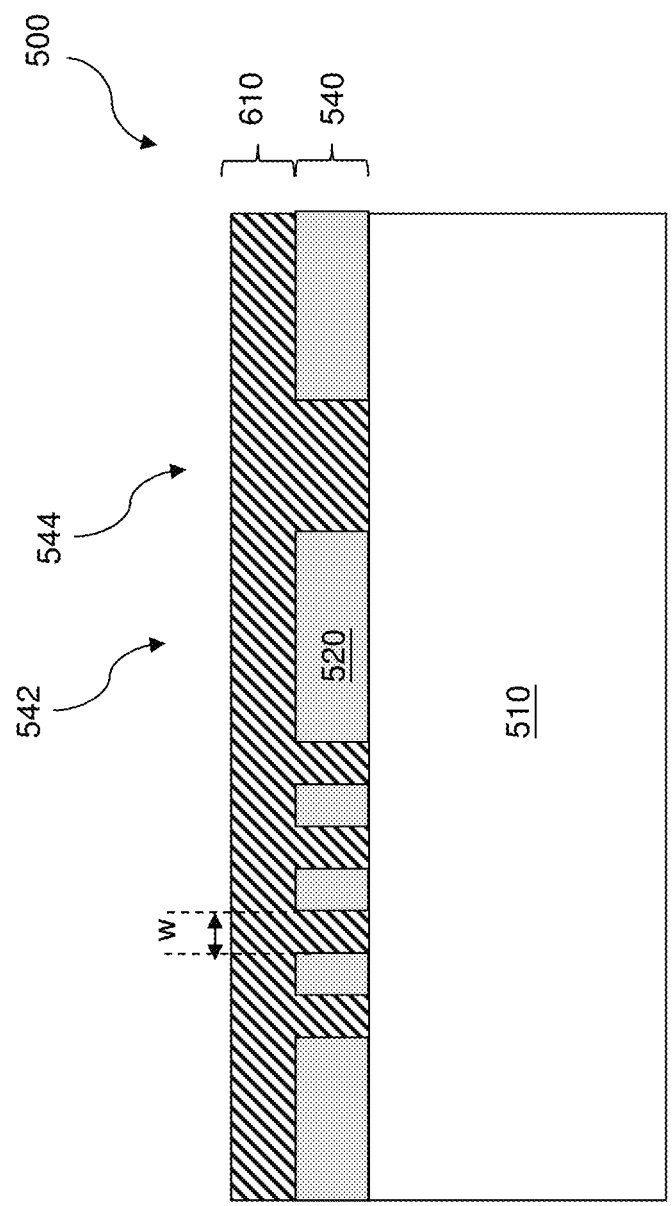

Referring to FIGS. 5 and 11, the method 300 proceeds to step 310 by depositing a hard mask layer 610 over the patterned sacrificial layer 540. The hard mask layer 610 is selected to be different materials from the sacrificial layer 520 to achieve etching selectivity during a subsequent etch process, which will be described in the following description. The hard mask layer 610 may include a silicon rich ARC layer deposited by spin-on coating techniques The hard mask layer 610 may also include silicon oxide, silicon nitride, silicon oxynitride, silicon carbide, aluminum oxide, hafnium oxide or any other suitable materials. In addition, the hard mask layer 610 may include a metal content ARC layer deposited by spin-on coating technique. In one embodiment, a thickness of the hard mask layer 610 is controlled to fully fill the fourth region 544 in the patterned sacrificial layer 540 and extends to above the patterned sacrificial layer 540. The hard mask layer 610 may be deposited by spin-on coating, CVD, atomic layer deposition (ALD), or other suitable techniques. In the present embodiment, the hard mask layer 610 is filled in the fourth region 544 conformably, including filling in the fourth region 544 having the smallest width w.

Figure 12:
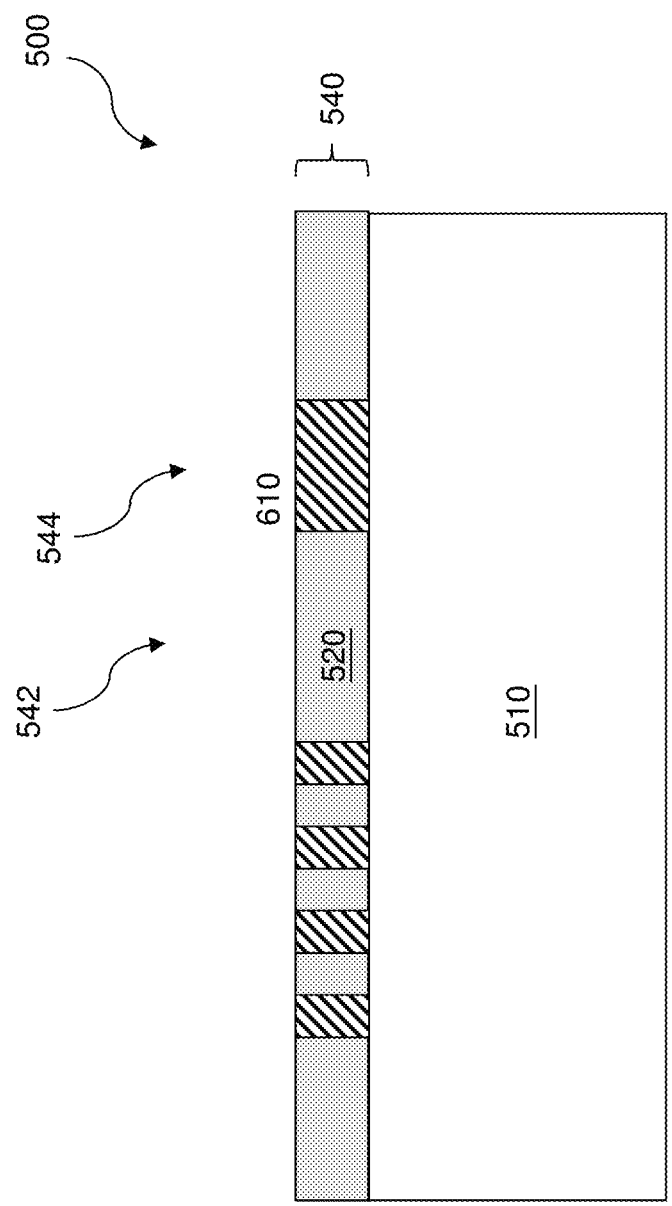

Referring to FIGS. 5 and 12, the method 300 proceeds to step 312 by recessing the hard mask layer 610 to expose a top surface of the patterned sacrificial layer 540. The hard mask layer 610 may be recessed by a dry etch, a wet etch, or other suitable technique. In one embodiment, a chemical mechanical polishing (CMP) process is applied to recess the hard mask layer 610 and expose the top surface of the patterned sacrificial layer 540.

Figure 13:
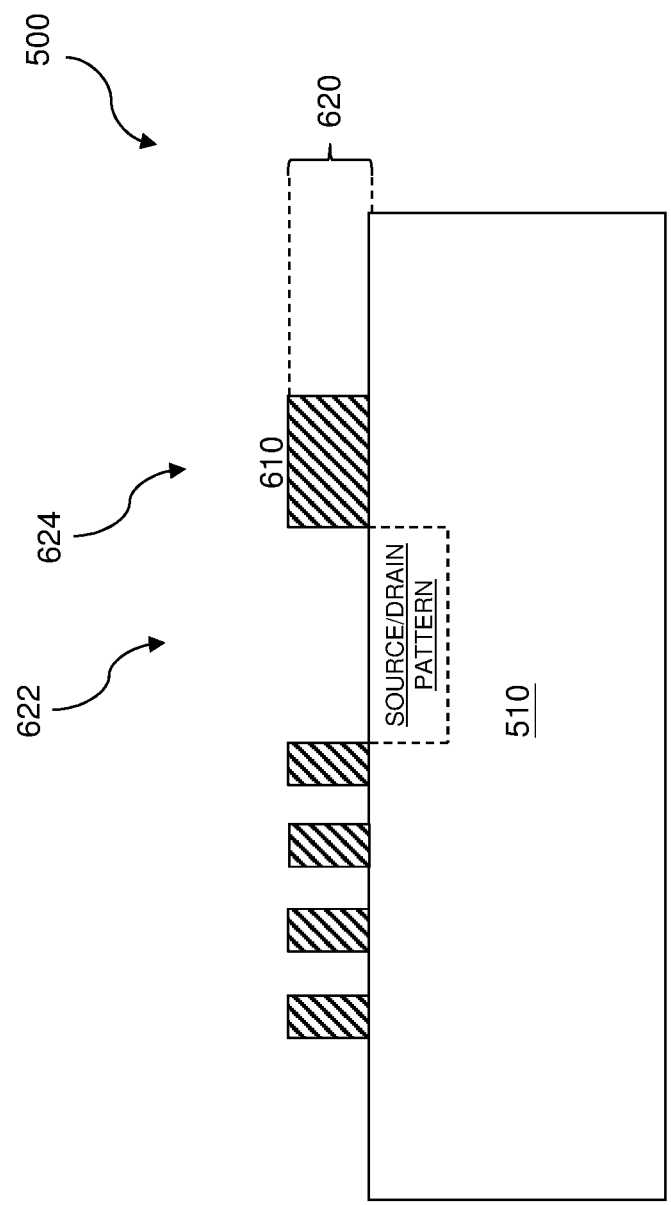

Referring to FIGS. 5 and 13, the method 300 proceeds to step 314 by selectively removing the patterned sacrificial layer 540. As has been mentioned previously the hard mask layer 610 is properly selected to have a different etch rate with the sacrificial layer 530. Thus, etch process selectively removes the patterned sacrificial layer 540 but does not substantially etch the hard mask layer 610. The etch process may include a wet etch, a dry etch, or a combination thereof. After removing the patterned sacrificial layer 540, the remained hard mask layer 610 forms a patterned hard mask layer 620.

The patterned hard mask layer 620 has an open region 622 where the hard mask layer 610 is removed and a block region 624 where the hard mask layer 610 remains. The third region 542 of the patterned sacrificial layer 540 is transferred to the block region 624 of the patterned hard mask layer while the fourth region 544 of the patterned sacrificial layer 540 is transferred to the open region 622 of the patterned hard mask layer 620. Thus, the patterned hard mask layer 620 has an inverse version of the pattern of the patterned sacrificial layer 540. Therefore, the patterned hard mask layer 620 has an inverse version of the first pattern of the inverse mask 410, referred to as a second pattern. Also therefore, the second pattern is same as the pattern of the regular mask of the design layout. By above multiple pattern transferring processes, the open region 622 of the second pattern is transferred from the opaque region 416 in the inverse mask 410 and the block region 624 of the second pattern is transferred from the reflective (or transmissive) region 418 in the inverse mask 410. In one embodiment, the second pattern represents a source/drain pattern for the IC device 500. In another embodiment, the second pattern represents a gate pattern for the IC device 500.

Additional steps can be provided before, during, and after the method 300, and some of the steps described can be replaced or eliminated for other embodiments of the method. Additionally, some steps may be performed concurrently with other steps.

Based on the above, it can be seen that the present disclosure offers a method of patterning wafer by multiple pattern-reversing processes. The method employs patterning a pattern of design layout to a wafer by using an inverse version of a mask of the design layout. The inverse version of the mask has an inverse area ratio to a respective regular mask. The method also employs using etch selectivity between a sacrificial layer and a hard mask layer to achieve one of pattern-reversing processes. The method provides pattern-reversing processes with quite simple spin-on coating process. The method demonstrates reducing the printable defect on wafer from a mask by the pattern-reversing processes.

The present disclosure provides a method for fabricating a semiconductor IC device. In one embodiment, the method includes forming a sacrificial layer over a substrate, forming a patterned photoresist layer over the sacrificial layer using a mask, wherein the mask includes a first pattern, etching the sacrificial layer through the patterned photoresist layer to form a patterned sacrificial layer, depositing a hard mask layer over the patterned sacrificial layer and removing the patterned sacrificial layer to form a second pattern on the hard mask layer, wherein the second pattern is an inverse pattern of the first pattern In another embodiment, a method for fabricating a semiconductor IC device includes forming a patterned photoresist layer over the sacrificial layer using a mask, wherein the mask includes a first pattern. The first pattern is an inverse pattern of a patterned feature to be formed over the substrate. The method also includes etching the sacrificial layer through the patterned photoresist layer to form a patterned sacrificial layer, depositing a hard mask layer over the patterned sacrificial layer and removing the patterned sacrificial layer to form the patterned feature on the substrate.

In yet another embodiment, a method for fabricating a semiconductor IC device includes providing an inverse mask having a first pattern. The method also includes depositing a sacrificial layer over a substrate, spin-on coating a photoresist layer over the sacrificial layer, patterning the photoresist layer by applying exposing process to the inverse mask. The patterned photoresist layer has the first pattern. The method also includes etching the sacrificial layer through the patterned photoresist layer to transfer the first pattern to the sacrificial layer, spin-on coating a hard mask layer over the sacrificial layer having the first pattern, recessing the hard mask layer to expose a top surface of the sacrificial layer and selectively removing the sacrificial layer to form a second pattern in the hard mask layer. Therefore the second pattern is a reverse version of the first pattern.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    forming a sacrificial layer over and physically contacting a substrate, wherein the sacrificial layer is a first antireflective coating material;
    after forming the sacrificial layer, forming a patterned photoresist layer over and physically contacting the sacrificial layer using a photomask, wherein the photomask includes a first pattern;
    after forming the patterned photoresist layer, etching the sacrificial layer using the patterned photoresist layer directly as an etch mask to expose portions of a topmost surface of the substrate, wherein etching the sacrificial layer forms a patterned sacrificial layer comprising a plurality of retained portions of the sacrificial layer laterally separated by one or more recesses that expose the portions of the topmost surface of the substrate;
    after etching the sacrificial layer, removing the patterned photoresist layer using a photoresist strip process;
    after removing the patterned photoresist layer, depositing a hard mask layer over the patterned sacrificial layer using a spin-on coating technique, wherein:

the hard mask layer is a second antireflective coating material that has a different etchant sensitivity than the first antireflective coating material of the plurality of retained portions of the sacrificial layer; and the spin-on coating technique is configured to cover topmost surfaces of the plurality of retained portions of the sacrificial layer and completely fill the one or more recesses separating the plurality of retained portions of the sacrificial layer such that, in each of the one or more recesses, the hard mask layer has a substantially coplanar bottom surface that physically contacts the exposed portions of the topmost surface of the substrate and such that the hard mask layer physically contacts sidewalls of the plurality of retained portions of the sacrificial layer defining the one or more recesses;

after depositing the hard mask layer, recessing the hard mask layer to expose the topmost surfaces of the plurality of retained portions of the sacrificial layer, wherein the recessing renders the topmost surfaces of the plurality of retained portions of the sacrificial layer substantially coplanar with a topmost surface of portions of the hard mask layer remaining in the one or more recesses;

after recessing the hard mask layer, simultaneously removing all of the plurality of retained portions of the sacrificial layer on the topmost surface of the substrate using an etchant to form an inverse-patterned hard mask layer, wherein the topmost surface of portions of the hard mask layer remaining in the one or more recesses and the topmost surfaces of the plurality of retained portions of the sacrificial layer are exposed to the etchant, wherein the etchant is selected to substantially avoid etching of the second antireflective coating material of the hard mask layer, wherein simultaneously removing all of the plurality of retained portions of the sacrificial layer exposes a sidewall of the hard mask layer, the inverse-patterned hard mask layer including a plurality of open regions where the plurality of retained portions of the sacrificial layer are removed and a plurality of block regions where the portions of the hard mask layer remain; and after simultaneously removing all of the plurality of retained portions of the sacrificial layer, using an open region of the plurality of open regions of the inverse-patterned hard mask layer to form a source/drain pattern in the substrate.

2. The method of claim 1, wherein the photomask is a reflective mask or a transmissive mask.

3. The method of claim 2, wherein the patterned sacrificial layer carries the first pattern.

4. The method of claim 1, wherein the sacrificial layer is formed by spin-on coating the first antireflective coating material.

5. The method of claim 4, wherein the second antireflective coating material of the hard mask layer is silicon-containing.

6. The method of claim 1, wherein the hard mask layer is recessed by a chemical mechanical polishing (CMP) process.

7. The method of claim 1, wherein the recessing of the hard mask layer renders the top surface of the hard mask layer substantially coplanar in a first region with a first recess width and in a second region with a second recess width that is different from the first recess width.

8. The method of claim 1, wherein the depositing of the hard mask layer is such that the top surface of the hard mask layer is substantially coplanar throughout prior to the recessing of the hard mask layer.

9. A method for fabricating a semiconductor integrated circuit (IC), the method comprising:
   forming a first layer of a first antireflective coating material over a substrate such that the first layer physically contacts a top surface of the substrate, wherein a source/drain pattern is yet to be defined in the substrate;
   subsequent to forming the first layer of the first antireflective coating material, patterning the first layer to include a first plurality of openings arranged according to a first pattern, wherein the patterning of the first layer includes:
      forming a patterned photoresist layer over and physically contacting the first layer, wherein the patterned photoresist layer includes the first pattern;
      after forming the patterned photoresist layer, etching the first layer using the patterned photoresist layer directly as an etch mask to form the first plurality of openings arranged according to the first pattern and exposing portions of the top surface of the substrate, wherein etching the first layer forms a patterned first layer comprising a plurality of retained portions of the first layer laterally separated by the first plurality of openings that expose the portions of the top surface of the substrate; and
      after etching the first layer, removing the patterned photoresist layer;
   subsequent to patterning the first layer to include the first plurality of openings, depositing a second layer of a second antireflective coating material having a different etching sensitivity than the first antireflective coating material of the first layer into the first plurality of openings of the patterned first layer, wherein:
      the depositing of the second layer includes a spin-coating process;
      the second layer fills each of the first plurality of openings;
      the second layer physically contacts the top surface of the substrate throughout the first plurality of openings of the patterned first layer; and
      the second layer physically contacts a vertical side surface of the first layer;
   subsequent to depositing the second layer of the second antireflective coating material, performing a chemical mechanical polishing process on the patterned first layer and the second layer to expose the patterned first layer such that a top surface of the patterned first layer is substantially coplanar with a top surface of the second layer extending from a first portion of the first layer to a second portion of the first layer;
   subsequent to performing the chemical mechanical polishing process on the patterned first layer and the second layer, selectively removing all of the plurality of retained portions of the first antireflective coating material of the patterned first layer simultaneously using an etchant so that the second layer includes a second plurality of openings arranged according to a second pattern, wherein:
      the etchant is selected to avoid significant etching of the second antireflective coating material of the second layer; and
   subsequent to selectively removing all of the plurality of retained portions of the first antireflective coating material of the patterned first layer simultaneously, using an opening of the second plurality of openings of the second layer to form the source/drain pattern in the substrate, thereby using the second pattern as a patterned hard mask layer for the substrate.

10. The method of claim 9, wherein the second pattern is an inverse of the first pattern.

11. The method of claim 9, wherein the second layer is a hard mask layer.

12. The method of claim 9, wherein the first antireflective coating material of the first layer is formed by spin-on coating.

13. The method of claim 9, wherein the second antireflective coating material of the second layer is a silicon-containing antireflective layer.

14. The method of claim 9, wherein:
the performing of the chemical mechanical polishing process renders the top surface of the second layer substantially coplanar in a first region with a first opening width and a second region with a second opening width that is different from the first opening width.

15. The method of claim 9, wherein the depositing of the second layer is such that the top surface of the second layer is substantially coplanar throughout prior to the performing of the chemical mechanical polishing process.

16. A method for fabricating a semiconductor integrated circuit (IC), the method comprising:
providing an inverse photomask having a first pattern;
after providing the inverse photomask, depositing a sacrificial layer containing a first antireflective coating material over a substrate such that the sacrificial layer physically contacts a top surface of the substrate, wherein a source/drain pattern is yet to be defined in the substrate;
after depositing the sacrificial layer, spin-on coating a photoresist layer over and physically contacting the sacrificial layer;
after spin-on coating the photoresist layer, patterning the photoresist layer using the inverse photomask, wherein the patterned photoresist layer has the first pattern;
after patterning the photoresist layer, etching the sacrificial layer through the patterned photoresist layer directly as an etch mask to form a first plurality of openings therein, the first plurality of openings being arranged according to the first pattern, wherein etching the sacrificial layer through the patterned photoresist layer further forms a plurality of retained portions of the sacrificial layer laterally separated by the first plurality of openings;
after etching the sacrificial layer, removing the patterned photoresist layer;
after removing the patterned photoresist layer, spin-on coating a hard mask layer containing a second antireflective coating material over the sacrificial layer and into the first plurality of openings, wherein:
the first antireflective coating material and the second antireflective coating material have different etchant selectivity; and
the second antireflective coating material of the hard mask layer physically contacts the top surface of the substrate throughout each of the first plurality of openings;
after spin-on coating the hard mask layer, recessing the hard mask layer to expose a top surface of the sacrificial layer, wherein the recessing renders the top surface of the sacrificial layer substantially coplanar with a top surface of the hard mask layer that extends from a first retained portion of the sacrificial layer to a second retained portion of the sacrificial layer;
after recessing the hard mask layer, selectively removing all of the plurality of retained portions of the sacrificial layer simultaneously to expose portions of the top surface of the substrate and forming a second plurality of openings in the hard mask layer, wherein:
the second plurality of openings is arranged according to a second pattern that is a reverse version of the first pattern;
the second pattern represents the source/drain pattern to be defined in the substrate; and
the selectively removing of the sacrificial layer exposes a vertical side surface of the hard mask layer; and
after selectively removing all of the plurality of retained portions of the sacrificial layer, using an opening of the second plurality of openings in the hard mask layer to form the source/drain pattern in the substrate using the second pattern as a patterned hard mask layer for the substrate.

17. The method of claim 16, wherein the second antireflective coating material of the hard mask layer is a silicon-containing antireflective material.

18. The method of claim 16, wherein the second antireflective coating material of the hard mask layer is a metal-containing antireflective material.

19. The method of claim 16, wherein the spin-on coating of the hard mask layer is such that the second antireflective coating material has a top surface that is substantially coplanar prior to the recessing of the hard mask layer.

* * * * *